US009065992B2

(12) United States Patent
Yamashita

(10) Patent No.: US 9,065,992 B2
(45) Date of Patent: Jun. 23, 2015

(54) SOLID-STATE IMAGE SENSOR AND CAMERA INCLUDING A PLURALITY OF PIXELS FOR DETECTING FOCUS

(75) Inventor: Yuichiro Yamashita, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 393 days.

(21) Appl. No.: 13/342,393

(22) Filed: Jan. 3, 2012

(65) Prior Publication Data

US 2012/0194714 A1 Aug. 2, 2012

(30) Foreign Application Priority Data

Jan. 28, 2011 (JP) ................................. 2011-017112

(51) Int. Cl.
*H04N 5/225* (2006.01)
*H01L 27/146* (2006.01)
*H04N 5/232* (2006.01)
*H04N 5/369* (2011.01)

(52) U.S. Cl.
CPC ........ *H04N 5/2254* (2013.01); *H01L 27/14627* (2013.01); *H01L 27/14629* (2013.01); *H01L 27/14645* (2013.01); *H04N 5/23212* (2013.01); *H04N 5/3696* (2013.01)

(58) Field of Classification Search
None
See application file for complete search history.

(56) References Cited

U.S. PATENT DOCUMENTS

| 7,064,405 | B2 | 6/2006 | Kondo et al. | |
| 7,119,319 | B2 | 10/2006 | Noto et al. | |
| 7,499,094 | B2 | 3/2009 | Kuriyama | |
| 7,732,884 | B2 | 6/2010 | Hashimoto | |
| 7,928,477 | B2 | 4/2011 | Kobayashi et al. | 257/225 |
| 8,094,225 | B2 | 1/2012 | Yamashita | 348/302 |
| 8,384,173 | B2 | 2/2013 | Matsugai | |
| 8,390,088 | B2 | 3/2013 | Hashimoto | |
| 8,634,017 | B2 | 1/2014 | Komuro | |
| 2004/0257460 | A1 | 12/2004 | Kuriyama | |
| 2005/0236553 | A1 | 10/2005 | Noto et al. | |
| 2006/0169870 | A1 | 8/2006 | Silsby et al. | |
| 2006/0255417 | A1 | 11/2006 | Kang | |
| 2007/0154200 | A1* | 7/2007 | Utagawa et al. | 396/111 |
| 2007/0215912 | A1* | 9/2007 | Kido et al. | 257/257 |
| 2009/0237801 | A1* | 9/2009 | Liu | 359/622 |
| 2010/0200738 | A1 | 8/2010 | Yamashita | 250/227.11 |

(Continued)

FOREIGN PATENT DOCUMENTS

| CN | 1574377 A | 2/2005 |
| CN | 1681131 A | 10/2005 |

(Continued)

OTHER PUBLICATIONS

Jan. 6, 2014 Chinese Official Action in Chinese Patent Appln. No. 201210015490.3.

(Continued)

*Primary Examiner* — Justin P Misleh
(74) *Attorney, Agent, or Firm* — Fitzpatrick, Cella, Harper & Scinto

(57) ABSTRACT

A solid-state image sensor includes a semiconductor region including a plurality of photoelectric converters from which signals are allowed to be independently read out; a first microlens; and a second microlens which is arranged between the first microlens and the semiconductor region, wherein the second microlens includes a central portion and a peripheral portion that surrounds the central portion, and a power of the peripheral portion is a positive value and larger than a power of the central portion.

8 Claims, 3 Drawing Sheets

(56) References Cited

U.S. PATENT DOCUMENTS

| | | |
|---|---|---|
| 2010/0201834 A1 | 8/2010 | Maruyama et al. |
| 2010/0302432 A1* | 12/2010 | Komuro ................... 348/340 |
| 2010/0314704 A1 | 12/2010 | Matsugai |
| 2011/0013062 A1 | 1/2011 | Yamashita ................ 348/294 |
| 2011/0076001 A1* | 3/2011 | Iwasaki ..................... 396/114 |
| 2011/0080492 A1 | 4/2011 | Matsuda et al. ........ 348/222.1 |
| 2011/0080493 A1 | 4/2011 | Kono et al. ............. 348/222.1 |
| 2011/0228147 A1* | 9/2011 | Matsuo et al. ............ 348/273 |
| 2011/0242380 A1 | 10/2011 | Ogura et al. .............. 348/300 |
| 2012/0007197 A1 | 1/2012 | Kikuchi et al. ............ 257/429 |
| 2012/0007203 A1 | 1/2012 | Kono et al. ............... 257/435 |
| 2012/0008030 A1 | 1/2012 | Kono et al. ............... 348/301 |

FOREIGN PATENT DOCUMENTS

| | | |
|---|---|---|
| CN | 1816117 A | 8/2006 |
| CN | 1862823 A | 11/2006 |
| CN | 101900867 A | 12/2010 |
| CN | 101924114 A | 12/2010 |
| JP | 2001-250931 A | 9/2001 |
| JP | 2006-032713 A | 2/2006 |
| JP | 2007-201266 A | 8/2007 |
| JP | 2007-281296 A | 10/2007 |
| JP | 2009-194340 A | 8/2009 |
| JP | 2010-186818 A | 8/2010 |
| WO | 2010/007792 A1 | 1/2010 |

OTHER PUBLICATIONS

Sep. 3, 2014 Chinese Office Action corresponding to foreign counterpart application Chinese Patent Application No. 201210015490.3
U.S. Appl. No. 13/353,620, filed Jan. 19, 2012.

* cited by examiner

SOLID-STATE IMAGE SENSOR AND CAMERA INCLUDING A PLURALITY OF PIXELS FOR DETECTING FOCUS

BACKGROUND OF THE INVENTION

1. Field of the Invention

The present invention relates to a solid-state image sensor and camera.

2. Description of the Related Art

Japanese Patent Laid-Open No. 2001-250931 discloses a solid-state image sensor having a focus detection function. Such a solid-state image sensor forms two images having a disparity by dividing a photodiode in each pixel for focus detection into two. By detecting a phase difference between these two images, a defocus amount can be obtained.

When the solid-state image sensor having the focus detection function is applied to a camera with an interchangeable lens, imaging lenses having various numerical apertures (NA), that is, f-numbers, are likely to be used. In order to put into a practical use as a camera system, it is required to satisfy characteristics of a given criterion or higher for every interchangeable lens.

A microlens provided to the solid-state image sensor is designed so that its focal point position matches near the surface of a photodiode. Incoming light through an imaging lens with a large f-number forms a small light spot on a photodiode. On the other hand, incoming light through a lens with a small f-number forms a large light spot on a photodiode. Therefore, in order to obtain constant luminous sensitivity in imaging lenses having various f-numbers, a microlens should be designed so that a light spot can be prevented from protruding from a photodiode portion as much as possible even when an imaging lens with a small f-number is used.

On the other hand, two divided photodiodes, which are arranged in each pixel to obtain phase-difference signals for focus detection, are arranged to be close to each other. A charge generated by light, which enters near a boundary between the two photodiodes, is likely to be accumulated by both the two photodiodes. A phenomenon where a charge generated by light entering one photodiode is accumulated by the other photodiode can be considered as crosstalk, which may lower the phase-difference detection precision and speed.

SUMMARY OF THE INVENTION

The present invention provides a technique advantageous to improve the sensitivity and to reduce crosstalk components in combinations with imaging lenses having various f-numbers.

The first aspect of the present invention provides a solid-state image sensor including a plurality of pixels for detecting focus based on a phase-difference detection method, the pixel including: a semiconductor region including a plurality of photoelectric converters from which signals are allowed to be independently read out; a first microlens; and a second microlens which is arranged between the first microlens and the semiconductor region, wherein the second microlens includes a central portion and a peripheral portion that surrounds the central portion, and a power of the peripheral portion is a positive value and larger than a power of the central portion.

The second aspect of the present invention provides a solid-state image sensor including a plurality of pixels for detecting focus based on a phase-difference detection method, the pixel including: a semiconductor region including a plurality of photoelectric converters from which signals are allowed to be independently read out; a microlens; and a reflecting surface which is arranged at a position that is between the microlens and the semiconductor region and near or at a boundary of a neighboring pixel, wherein the reflecting surface is arranged to reflect light incident thereon toward the semiconductor region.

The third aspect of the present invention provides a camera comprising: a solid-state image sensor defined as the first or second aspect of the present invention; and a processor for processing signals output from the solid-state image sensor.

Further features of the present invention will become apparent from the following description of exemplary embodiments with reference to the attached drawings.

DESCRIPTION OF THE EMBODIMENTS

A solid-state image sensor of the present invention includes a plurality of pixels required for focus detection based on a phase-difference detection method (such pixels will also be referred to as focus detection pixels hereinafter). The focus detection pixels can also be used as imaging pixels (that is, pixels required to acquire an image). The solid-state image sensor of the present invention includes the first number of pixels, and may be practiced as a MOS image sensor, a CCD image sensor, or other image sensors. Note that the MOS image sensor can include a backside illumination type MOS image sensor.

Each focus detection pixel includes a semiconductor region including a plurality of photoelectric converters from which signals can be read out independently. The plurality of photoelectric converters respectively receive light rays which have passed through different areas of a pupil of an imaging lens required to form an image of an object on an imaging surface of the solid-state image sensor. The plurality of focus detection pixels are arranged in a linear or cross pattern, and a phase difference between light rays which have passed through the different areas of the pupil of the imaging lens can be detected by processing signals read out from the plurality of focus detection pixels.

Some embodiments of the solid-state image sensor of the present invention will be described hereinafter. Note that the arrangement of a focus detection pixel will be described hereinafter, but such description does not intend that all pixels of the solid-state image sensor have to be focus detection pixels, and the solid-state image sensor can include pixels used for only imaging.

Figure 1:
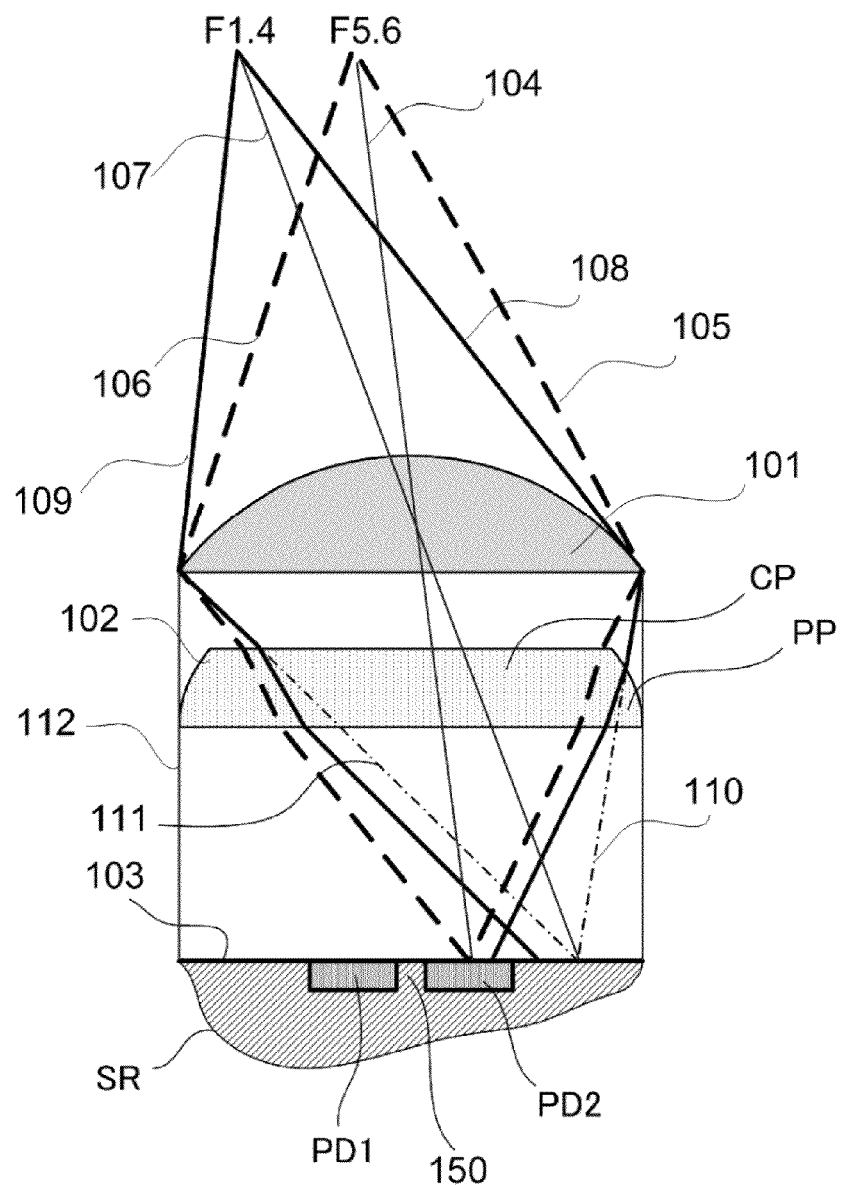
FIG. 1 is a sectional view illustrating the arrangement of a solid-state image sensor according to the first embodiment of the present invention.

The arrangement of a solid-state image sensor according to the first embodiment of the present invention will be described below with reference to FIG. 1. FIG. 1 shows one focus detection pixel of the solid-state image sensor and rays. The focus detection pixel can include a semiconductor region SR, first microlens (surface microlens) 101, and second microlens (inner microlens) 102 which is arranged between the first microlens 101 and semiconductor region SR. The semiconductor region SR includes a plurality of photoelectric converters PD1 and PD2, from which signals can be independently read out. In the example shown in FIG. 1, one focus detection pixel includes two photoelectric converters PD. However, one focus detection pixel may include three, four, or five or more photoelectric converters. When one focus detection pixel includes four photoelectric converters, two photoelectric converters can be arranged along a first direction (for example, a horizontal direction), and two remaining photoelectric converters may be arranged along a second direction (for example, a vertical direction) perpendicular to the first direction.

Insulating films 112 are arranged between a surface 103 of the semiconductor region SR and second microlens and between the second microlens 102 and first microlens 101. A refractive index of each insulating film 112 is typically lower than those of the first and second microlenses 101 and 102. Note that FIG. 1 does not illustrate elements such as element isolations, wiring patterns, and transistors for the sake of simplicity.

The second microlens 102 includes a central portion CP and a peripheral portion (typically, an annular portion) PP which surrounds the central portion CP, and a power of the peripheral portion PP is a positive value and larger than that of the central portion CP. For example, the radius of curvature of the peripheral portion PP is larger than that of the central portion CP. The central portion CP can be, for example, a parallel plate.

Rays indicated by solid lines are those having a maximum incidence angle of rays which enter the focus detection pixel when an f-number value of the imaging lens is 1.4. Reference numeral 107 denotes a principal ray; and 108 and 109, rays (peripheral rays) which pass through end portions of the imaging lens. Rays indicated by dotted lines are those having a maximum incidence angle of rays which enter the focus detection pixel when an f-number value of the imaging lens is 5.6 (which is a maximum f-number generally used by the camera for focus detection). Reference numeral 104 denotes a principal ray; and 105 and 106, rays (peripheral rays) which pass through end portions of the imaging lens. One-dashed chain lines 110 and 111 indicate loci through which the rays 108 and 109 pass when no second microlens 102 is included.

Note that the f-number of the imaging lens is also called an aperture value. Even when an identical imaging lens is used, light rays corresponding to a smaller f-number can enter the solid-state image sensor by setting a larger aperture value. Conversely, by setting a smaller aperture value, light rays corresponding to a larger f-number can enter the solid-state image sensor. Assume that the "f-number" described in this specification includes not only a minimum f-number of the imaging lens but also an NA specified by controlling a stop of the imaging lens.

In order to improve the focus detection precision (phase-difference detection precision), it is preferable to reduce a ratio of crosstalk components which occupy signals read out from the two photoelectric converters PD1 and PD2 in one focus detection pixel. Hence, an arrangement that can reduce light rays entering an isolation portion 150 between the two photoelectric converters PD1 and PD2 (it is unknown if these light rays are detected by either of the photoelectric converters PD1 and PD2) is adopted. A ratio of light rays entering the isolation portion 150 depends on the radii of curvature (powers) of the first and second microlenses 101 and 102, that is, the size of a light spot formed on the surface 103 by light entering the semiconductor region SR. Typically, the first microlens 101 is configured to form a light spot, which fully covers the photoelectric converters PD1 and PD2, on the surface of the semiconductor region SR when the f-number is 5.6 (to be described as "F5.6" hereinafter). This is advantageous to reduce the ratio of light rays entering the isolation portion 150, that is, to reduce crosstalk components, and to improve the sensitivity.

When the f-number is 1.4 (to be described as "F1.4" hereinafter), a light spot can become larger than that in the case of F5.6. In this case, the second microlens 102 changes optical paths of rays such as the rays 108 and 109 (peripheral rays), which have a large angle difference from the principal ray 107, toward a central axis (those of the first and second microlenses 101 and 102) direction. Especially, when no second microlens 102 is arranged, the ray 108 does not enter the photoelectric converter PD2, but when the second microlens 102 is arranged, it enters the photoelectric converter PD2. This is advantageous not only to improve sensitivity but also to reduce crosstalk components. For example, the second microlens 102 is configured to allow all the rays to pass through the central portion CP in case of F5.6, and to allow the peripheral rays having a large angle difference from the principal ray to pass through the peripheral portion PP and to allow other rays to pass through the central portion PP in the case of F1.4.

According to the first embodiment, the sensitivity can be improved and crosstalk components can be reduced at various f-numbers such as F1.4 and F5.6. Note that the f-numbers=1.4 and 5.6 have been described in this embodiment, but they are merely examples of different f-numbers, and do not limit the present invention.

The second microlens 102 may be configured as a lens which is made up of a material having a higher refractive index than the neighboring insulating film 112 and has a convex surface, or as a lens which is made up of a material having a lower refractive index than the neighboring insulating film 112 and has a concave surface. The second microlens 102 may be configured by, for example, a photonic crystal or diffraction grating.

The above design method can be understood as a method of shortening focal lengths of peripheral rays at F1.4. Alternatively, a design method of prolonging focal lengths of central rays (those which have a small angle difference from the principal ray) at F5.6 may be adopted. In this case, the size of a light spot formed on the surface 103 of the semiconductor region SR at F1.4 can be determined earlier.

At an interface between the second microlens 102 and insulating film 112, an anti-reflection mechanism can be arranged. The second microlens 102 can be formed using, for example, area coverage modulation exposure or grayscale exposure or using an etch-back technique.

Figure 2:
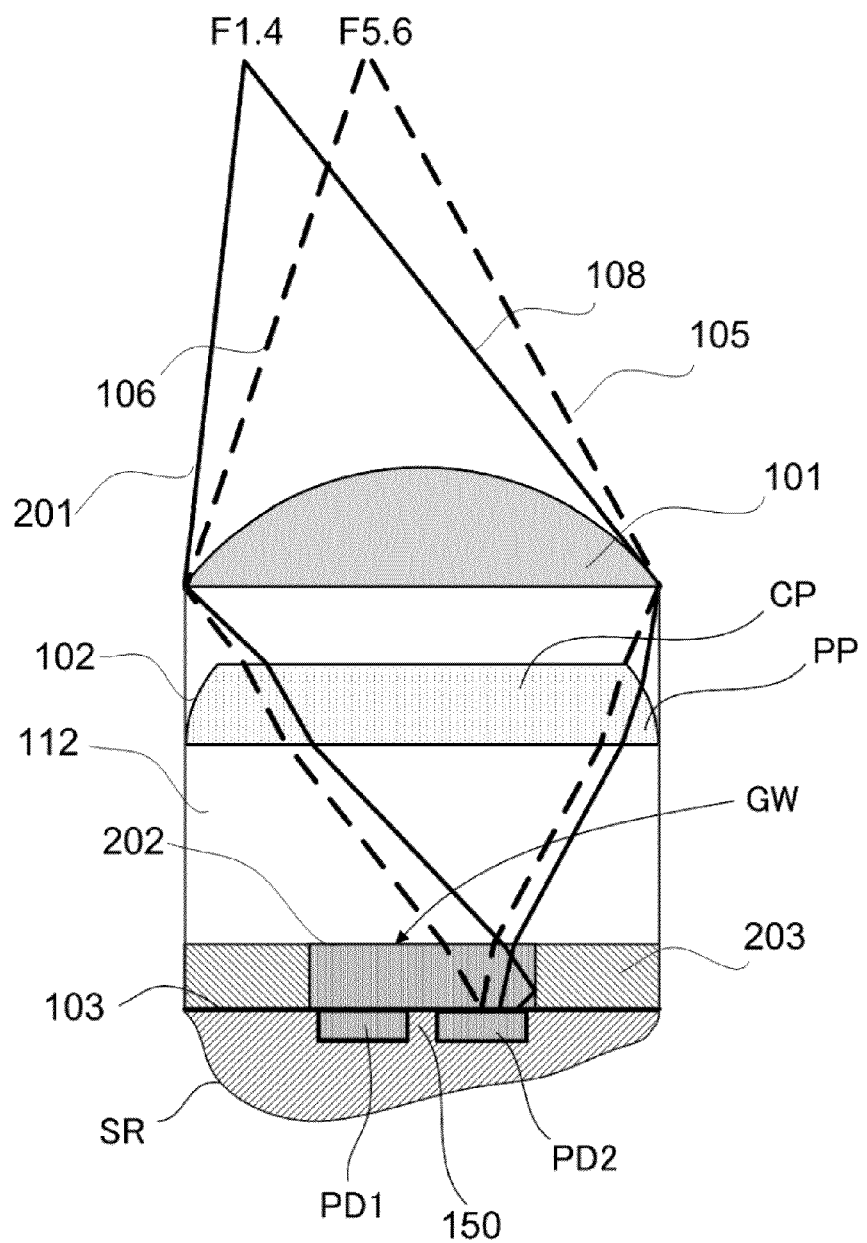
FIG. 2 is a sectional view illustrating the arrangement of a solid-state image sensor according to the second embodiment of the present invention.

The arrangement of a solid-state image sensor according to the second embodiment of the present invention will be described below with reference to FIG. 2. Note that items, which are not mentioned in the second embodiment, can follow the first embodiment. The solid-state image sensor of the second embodiment is different from that of the first embodiment in that a waveguide GW is arranged between a second microlens 102 and semiconductor region SR. The waveguide GW includes a first portion 202 and a second portion 203 which surrounds the side face of the first portion 202, and a refractive index of the first portion 202 is higher than that of the second portion 203.

According to the second embodiment, rays 201, which cannot be guided to photoelectric converters PD1 and PD2 even by arranging the second microlens 102, are guided to the photoelectric converters PD1 and PD2 by the waveguide GW.

Thus, the second embodiment can improve the sensitivity compared to the first embodiment.

Note that the waveguide GW may be implemented by configuring both the first and second portions 202 and 203 using a solid. Alternatively, the waveguide GW may be implemented by configuring the first portion 202 using a solid and configuring the second portion 203 or gaps between the second and first portions 203 and 202 using a gas such as air or space. Alternatively, the waveguide GW may be configured to change optical paths of rays toward a central axis (those of a first microlens 101 and the second microlens 102) direction using a reflecting film such as a metal film.

Figure 3:
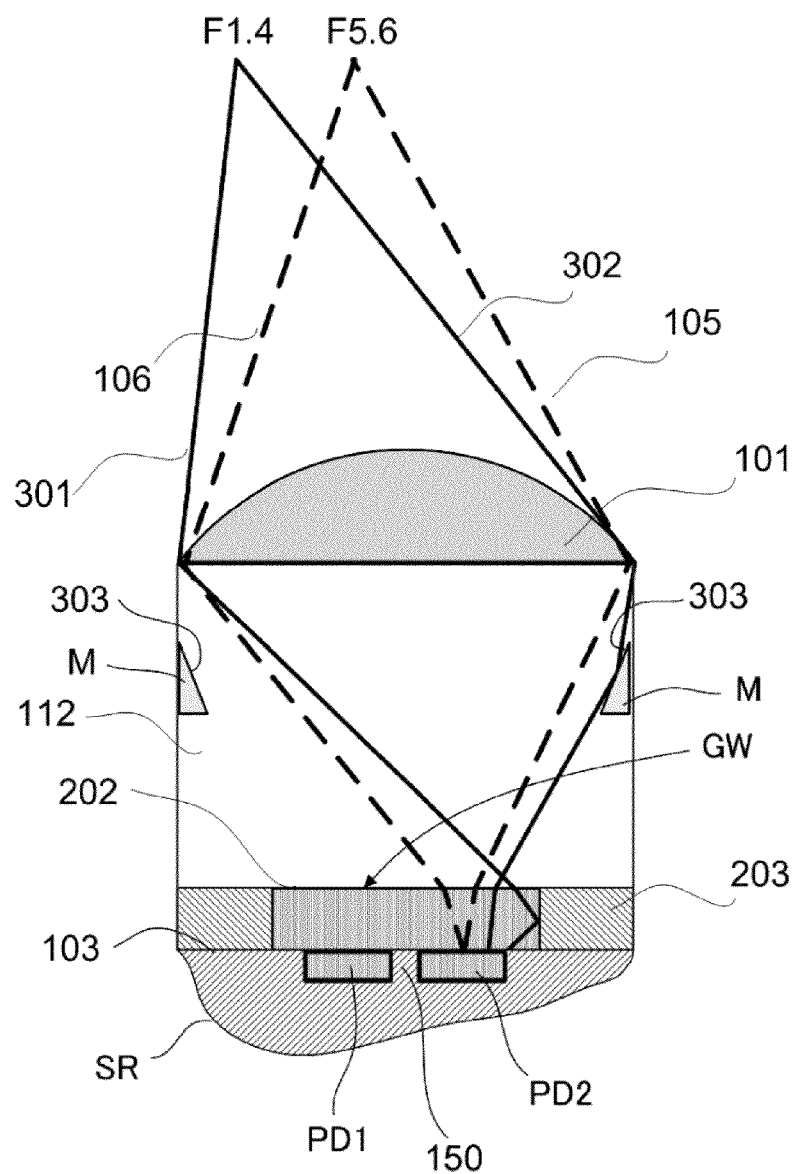
FIG. 3 is a sectional view illustrating the arrangement of a solid-state image sensor according to the third embodiment of the present invention.

The arrangement of a solid-state image sensor according to the third embodiment of the present invention will be described below with reference to FIG. 3. Note that items, which are not mentioned in the third embodiment, can follow the first or second embodiment.

A focus detection pixel can include a semiconductor region SR, a microlens 101, and reflecting surfaces 303 arranged between the microlens 101 and semiconductor region SR. The semiconductor region SR includes a plurality of photoelectric converters PD1 and PD2, from which signals can be independently read out. Each of the reflecting surfaces 303 are arranged at a position that is between the microlens 101 and semiconductor region SR and near or at the boundary of neighboring pixels, so as to reflect light incident on the reflecting surfaces 303 toward the semiconductor region SR. Each reflecting surface 303 can be implemented by a mirror member M, which is configured by aluminum normally used as a wiring material, or by a material prepared by mixing other metal atoms in aluminum at a weight ratio of about 0.5% to 5%.

A ray 302 at F1.4 is reflected by the reflecting surface 303 toward the central axis direction of the microlens 101, and enters the photoelectric converter PD2. Another ray 301 at F1.4 is reflected by a reflecting surface which configures a waveguide GW, and enters the photoelectric converter PD2. Note that the waveguide GW is preferably arranged, but it is not indispensable.

According to the third embodiment, since the need for the second microlens 102 can be obviated unlike in the first and second embodiments, a sensitivity drop due to reflection at a boundary surface of the second microlens 102 can be prevented.

As an application example of the solid-state image sensor according to each of the aforementioned embodiments, a camera which includes the solid-state image sensor will be exemplified below. The camera is typically a camera with an interchangeable lens, but may be a camera with an imaging lens, which is fixed to a camera body. Even in the latter camera, the solid-state image sensor can be used in combinations of various f-numbers and the imaging lens according to design specifications. The concept of a camera includes not only a device primarily intended to imaging but also a device which includes an auxiliary imaging function (for example, a personal computer and mobile terminal). The camera includes the solid-state image sensor according to the present invention, which is exemplified as each of the above embodiments, and a processor which processes signals output from the solid-state image sensor. The processor detects a phase difference between rays which have passed through different areas in a pupil of an imaging lens based on signals read out from focus detection pixels, and executes auto-focus control by controlling a driver of the imaging lens (typically, a focus lens included in the imaging lens) based on the phase difference.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-017112, filed Jan. 28, 2011, which is hereby incorporated by reference herein in its entirety.

What is claimed is:

1. A solid-state image sensor including a plurality of pixels for detecting focus based on a phase-difference detection method, each of the plurality of pixels including:
    a semiconductor region including a plurality of photoelectric converters from which signals are allowed to be independently read out for detecting focus;
    a first microlens;
    a second microlens, made of a single material, which is arranged between the first microlens and the semiconductor region; and
    an insulating film arranged between the second microlens and the semiconductor region, the insulating film having a flat upper surface,
    wherein the second microlens includes a central portion and a peripheral portion that surrounds the central portion, the central portion having a flat upper surface, and a flat lower surface in contact with the flat upper surface of the insulating film, the peripheral portion having a upper surface, and a flat lower surface in contact with the flat upper surface of the insulating film, and
    wherein the upper surface of the peripheral portion is configured such that the peripheral portion has a positive power.

2. The sensor according to claim 1, wherein each of the plurality of pixels further includes a waveguide commonly provided to the plurality of photoelectric converters, the waveguide being arranged between the second microlens and the semiconductor region.

3. The sensor according to claim 2, wherein each or the waveguides include a first portion and a second portion which surrounds a side face of the first portion, a refractive index of the first portion being higher than a refractive index of the second portion.

4. The sensor according to claim 1, wherein the second microlens has no step between the flat upper surface of the central portion and the upper surface of the peripheral portion.

5. The sensor according to claim 1, wherein a ray that passes through the first microlens in a case where an imaging lens has a f-number value of 5.6 does not enter the peripheral portion of the second microlens, and a ray that passes through the first microlens in a case where an imaging lens has a f-number value less than 5.6 enters the peripheral portion of the second microlens.

6. The sensor according to claim 1, wherein a ray that passes through the first microlens in a case where an imaging lens has a f-number value of 5.6 does not enter the peripheral portion of the second microlens, and a ray that passes through the first microlens in a case where an imaging lens has a f-number value of 1.4 enters the peripheral portion of the second microlens.

7. The sensor according to claim 1, wherein the central portion having the flat upper surface and the flat lower surface are located in parallel planes.

8. A camera comprising:
a solid-state image sensor according to claim 1; and
a processor for processing signals output from the solid-state image sensor.

* * * * *